United States Patent
Segal et al.

(10) Patent No.: US 7,114,142 B1
(45) Date of Patent: Sep. 26, 2006

(54) OPTIMIZING LOCATIONS OF PINS FOR BLOCKS IN A HIERARCHICAL PHYSICAL DESIGN BY USING PHYSICAL DESIGN INFORMATION OF A PRIOR HIERARCHICAL PHYSICAL DESIGN

(75) Inventors: Russell Segal, Sunnyvale, CA (US); Paul Rodman, Palo Alto, CA (US)

(73) Assignee: Magam Design Automoation, Inc., Santa Clara, CA (US)

( * ) Notice: Subject to any disclaimer, the term of this patent is extended or adjusted under 35 U.S.C. 154(b) by 0 days.

(21) Appl. No.: 10/855,667

(22) Filed: May 26, 2004

Related U.S. Application Data

(63) Continuation-in-part of application No. 09/714,722, filed on Nov. 15, 2000, now Pat. No. 6,857,116.

(51) Int. Cl.
G06F 17/50 (2006.01)

(52) U.S. Cl. .............. 716/13; 716/12; 716/14

(58) Field of Classification Search ............. 716/7–14, 716/2
See application file for complete search history.

(56) References Cited

U.S. PATENT DOCUMENTS

| 5,604,680 | A  | * | 2/1997 | Bamji et al. ............. 716/8 |
| 6,230,304 | B1 | * | 5/2001 | Groeneveld et al. ........ 716/7 |
| 6,243,854 | B1 | * | 6/2001 | Lavin et al. .............. 716/19 |
| 6,275,971 | B1 | * | 8/2001 | Levy et al. ............... 716/5 |
| 6,360,356 | B1 | * | 3/2002 | Eng ..................... 716/18 |

* cited by examiner

*Primary Examiner*—Stacy A. Whitmore
*Assistant Examiner*—Binh Tat
(74) *Attorney, Agent, or Firm*—Fenwick & West LLP

(57) ABSTRACT

Method of optimizing locations of pins for blocks in a hierarchical physical design by using physical design information of a prior hierarchical physical design is provided and described. In one embodiment, a method of determining a plurality of locations of pins for each block of a physical design of a current integrated circuit includes retrieving physical design information from a prior physical design of a prior integrated circuit. The physical design information includes a routing congestion profile. Continuing, a router is provided a plurality of constraints based on the routing congestion profile. Then, the router is used to perform a top-level route for generating locations of pins for each block. Each pin of the block is created at a location where a global route enters the block or a location where a global route exits the block.

21 Claims, 12 Drawing Sheets

210

500

| 75 | 60 | 75 | 60 | 75 | 95 | 60 | 75 | 60 | 95 | 60 | 75 | 60 |
|----|----|----|----|----|----|----|----|----|----|----|----|----|
| 60 | 60 | 60 | 60 | 60 | 60 | 60 | 60 | 60 | 60 | 60 | 60 | 60 |
| 60 | 75 | 60 | 95 | 95 | 95 | 60 | 60 | 60 | 90 | 90 | 60 | 75 |
| 75 | 60 | 60 | 95 | 95 | 95 | 60 | 60 | 75 | 90 | 90 | 60 | 60 |
| 60 | 60 | 60 | 95 | 95 | 95 | 60 | 75 | 60 | 90 | 90 | 60 | 95 |
| 60 | 60 | 60 | 60 | 60 | 60 | 60 | 60 | 60 | 75 | 60 | 60 | 60 |
| 75 | 60 | 60 | 60 | 60 | 60 | 75 | 60 | 75 | 60 | 60 | 60 | 75 |
| 60 | 60 | 60 | 60 | 75 | 60 | 60 | 60 | 60 | 60 | 75 | 60 | 60 |
| 60 | 60 | 95 | 60 | 60 | 60 | 60 | 75 | 60 | 60 | 60 | 60 | 60 |
| 95 | 75 | 60 | 60 | 60 | 60 | 60 | 80 | 80 | 80 | 80 | 75 | 95 |
| 60 | 60 | 60 | 60 | 60 | 60 | 75 | 80 | 80 | 80 | 80 | 60 | 60 |
| 95 | 60 | 60 | 75 | 60 | 60 | 60 | 80 | 80 | 80 | 80 | 60 | 75 |
| 75 | 60 | 60 | 60 | 60 | 95 | 60 | 80 | 80 | 80 | 80 | 75 | 60 |
| 60 | 60 | 60 | 60 | 60 | 60 | 75 | 60 | 60 | 75 | 60 | 60 | 60 |
| 75 | 95 | 75 | 95 | 75 | 60 | 60 | 95 | 60 | 60 | 60 | 60 | 95 |

Figure 5

OPTIMIZING LOCATIONS OF PINS FOR BLOCKS IN A HIERARCHICAL PHYSICAL DESIGN BY USING PHYSICAL DESIGN INFORMATION OF A PRIOR HIERARCHICAL PHYSICAL DESIGN

CROSS REFERENCE TO RELATED APPLICATION

This patent application is a Continuation-in-Part of, commonly-owned U.S. patent application Ser. No. 09/714,722, filed on Nov. 15, 2000, now U.S. Pat. No. 6,857,116 entitled "OPTIMIZATION OF ABUTTED-PIN HIERARCHICAL PHYSICAL DESIGN", by Dahl et al., which is incorporated herein by reference.

BACKGROUND OF THE INVENTION

1. Field of the Invention

The present invention generally relates to generating a physical design for an integrated circuit chip. More particularly, the present invention relates to the field of optimizing locations of pins in blocks in a hierarchical physical design by using physical design information of a prior hierarchical physical design.

2. Related Art

The process of generating a physical design for an integrated circuit chip is complicated. The physical design represents the layout of the integrated circuit chip on a semiconductor, such as silicon, and is utilized to fabricate the integrated circuit chip. There are several types of physical designs: flat physical designs and hierarchical physical designs. Typically, the physical design is generated in several stages. Examples of these stages include floorplanning, placement, routing, and verification. In a flat physical design, these stages are sequentially performed on the entire layout, while in a hierarchical physical design these stages are sequentially performed on partitions of the layout referred as blocks (or place-and-route blocks).

Floorplanning is performed before placement and routing. Thus, floorplanning affects subsequent stages such as placement and routing. The main goal and objective of floorplanning is creating a floorplan. The floorplan can determine whether placement and routing are possible for the physical design.

During the top-level floorplanning stage of a hierarchical physical design, blocks are arranged on a selected chip area and chip shape. In arranging the blocks, individual blocks are sized and shaped. These blocks can have any number of cells that execute digital or analog functions (e.g., NAND, NOR, D flip-flop, etc.) by connectively grouping circuit elements such as transistors, capacitors, resistors, and other circuit elements. Moreover, these blocks can have one or more macrocells. A macrocell is a functional module such as RAM, ROM, ALU, etc. Each of these cells and macrocells has one or more ports (or terminals) for inputting signals or outputting signals, each of which, in turn, may connect to one or more ports of other cells and macrocells via metal wires. A net is a set of two or more ports that are connected. Generally, the input to the floorplanning stage is a netlist for the integrated circuit chip. A netlist is a list of nets for the integrated circuit chip.

Continuing, the location of Input/Output blocks is determined. These Input/Output blocks facilitate connections/communication with external components. An Input/Output block may have bonding pad cells or bump cells. Moreover, power distribution and clock distribution are determined during the top-level floorplanning stage of the hierarchical physical design. Furthermore, the top-level floorplanning stage is performed with the objectives of minimizing the chip area and minimizing delay.

Additionally, the locations of pins for each block are determined. Each pin of a block represents a location where a signal enters the block or a location where a signal exits the block. The pins are utilized in placing and routing each block during block-level operations. At the top-level of a hierarchical physical design, a router is used to route nets representing two or more ports of different blocks that are connected. A global route is created for each of these nets. In general, a location of a pin is defined where the routing wire (or global route) crosses the boundary of the block.

SUMMARY OF THE INVENTION

Method of optimizing locations of pins for blocks in a hierarchical physical design by using physical design information of a prior hierarchical physical design is provided and described. In one embodiment, a method of determining a plurality of locations of pins for each block of a physical design of a current integrated circuit includes retrieving physical design information from a prior physical design of a prior integrated circuit. The physical design information includes a routing congestion profile. Continuing, a router is provided a plurality of constraints based on the routing congestion profile. Then, the router is used to perform a top-level route for generating locations of pins for each block. Each pin of the block is created at a location where a global route enters the block or a location where a global route exits the block.

BRIEF DESCRIPTION OF THE DRAWINGS

The accompanying drawings, which are incorporated in and form a part of this specification, illustrate embodiments of the invention and, together with the description, serve to explain the principles of the present invention.

FIG. 5 illustrates an exemplary routing congestion profile in accordance with an embodiment of the present invention.

DETAILED DESCRIPTION OF THE INVENTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details.

Method of optimizing locations of pins for blocks in a hierarchical physical design by using physical design information of a prior hierarchical physical design is provided and described herein. The following description of the invention is applicable to physical designs for integrated circuit chips. Moreover, the invention can be practiced on the entire physical design. Additionally, the invention can be practiced on a portion of the physical design, and then this portion of the physical design can be integrated with the rest of the physical design.

Although the description of the invention will focus on hierarchical physical designs, it should be understood that the invention is applicable to other types of physical designs. Moreover, the description of the invention will focus on an abutted-pin hierarchical physical design. It should be understood that the invention is applicable to other types of hierarchical physical designs.

A detailed description of an abutted-pin hierarchical physical design can be found in the co-pending, commonly-owned U.S. patent application Ser. No. 09/714,722, filed on Nov. 15, 2000, entitled "OPTIMIZATION OF ABUTTED-PIN HIERARCHICAL PHYSICAL DESIGN", by Dahl et al., which is incorporated herein by reference.

As discussed above, the floorplanning stage of a hierarchical physical design affects subsequent physical design stages such as placement and routing. If the floorplanning stage takes into account the goals, objectives, and causes of problems associated with the placement and routing stages, a floorplan is generated which can facilitate, enhance, and optimize the placement and routing stages.

Figure 1A:
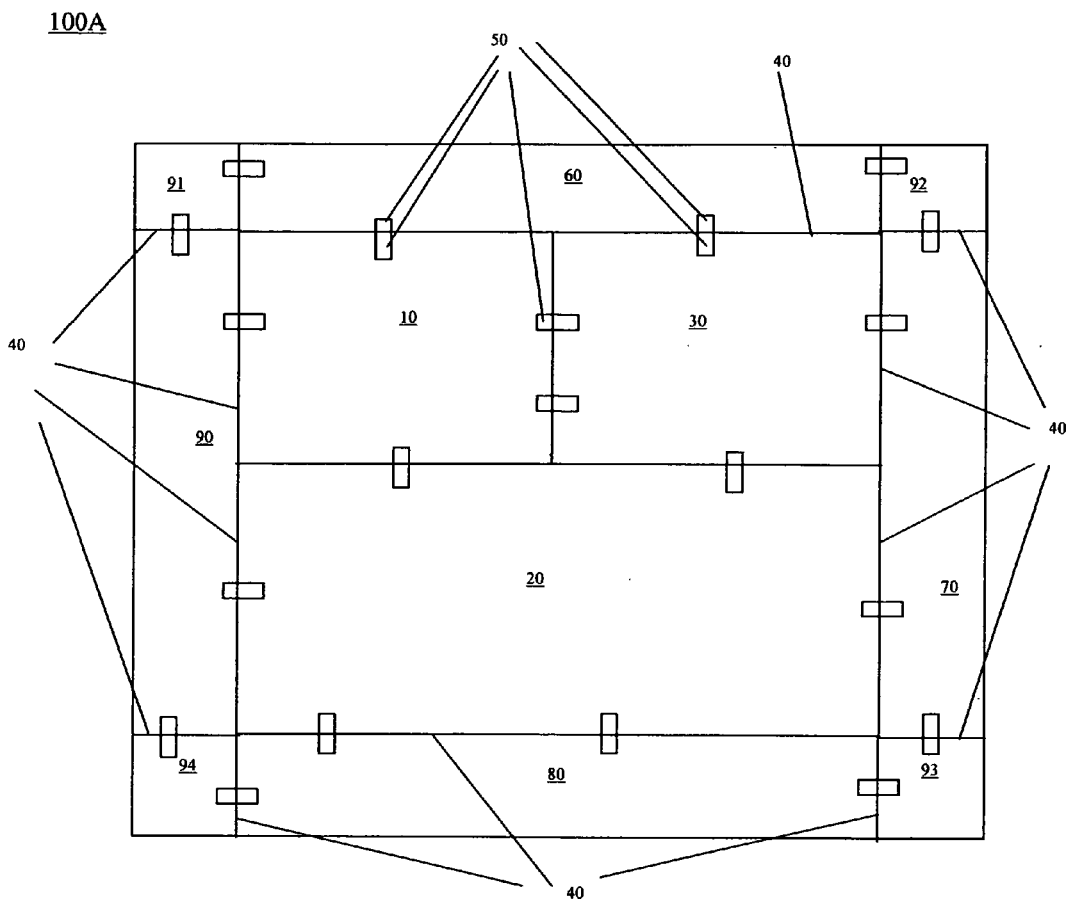
FIG. 1A illustrates a top-level floorplan of an abutted-pin hierarchical physical design in accordance with an embodiment of the present invention.

FIG. 1A illustrates a top-level floorplan 100A of an abutted-pin hierarchical physical design in accordance with an embodiment of the present invention. As depicted in FIG. 1A, the top-level floorplan 100A includes a plurality of blocks 10–30 and 60–94. The blocks 10–30 and 60–94 are partitions of the netlist, which is provided as an input to the floorplanning stage. These blocks 10–30 and 60–94 are also referred to as place-and-route blocks (pnr blocks). One distinguishing feature of the top-level floorplan 100A of an abutted-pin hierarchical physical design is the lack of routing channels between the blocks 10–30 and 60–94. Here, edges 40 of one block abut edges 40 of another block. Hence, the entire chip area and chip shape utilized in the top-level floorplan 100A is covered with blocks 10–30 and 60–94. Another distinguishing feature of the top-level floorplan 100A of an abutted-pin hierarchical physical design is the merging of traditional top-level components or objects (e.g., timing components, clock distribution wiring, power distribution wiring, repeaters, buffers, etc.) into the individual blocks 10–30 and 60–94 and corresponding block-level netlists.

Continuing with FIG. 1A, blocks 10–30 form a core area of the top-level floorplan 100A. These blocks 10–30 have cells and macrocells providing the primary digital and/or analog functionality of the integrated circuit chip fabricated using this top-level floorplan 100A. Blocks 60–94 form a padring area of the top-level floorplan 100A. These blocks 60–94 have bonding pad cells or bump cells and other support circuitry cells of the integrated circuit chip fabricated using this top-level floorplan 100A. Although the blocks 10–30 and 60–94 have rectangular shapes, it should be understood that the blocks 10–30 and 60–94 can have rectilinear shapes. Moreover, it should be understood that the top-level floorplan 100A can have more or less than the blocks depicted in FIG. 1A.

As described above, blocks 10–30 and 60–94 can have cells and macrocells. Each of these cells and macrocells has one or more ports (or terminals) for inputting signals or outputting signals, each of which, in turn, may connect to one or more ports of other cells and macrocells via metal wires. A net is a set of two or more ports that are connected.

Each block 10–30 and 60–94 has one or more pins 50. Each pin 50 of a block 10–30 and 60–94 represents a location where a signal enters the block or a location where a signal exits the block. The pins 50 are utilized in placing and routing each block during block-level operations. At the top-level of a hierarchical physical design (e.g., an abutted-pin hierarchical physical design), a router is used to route nets representing two or more ports of different blocks that are connected. In general, a location of a pin 50 is defined where the routing wire crosses the boundary or edge 40 of the block. Since boundaries or edges 40 of one block 10–30 and 60–94 abut boundaries or edges 40 of another block 10–30 and 60–94, the pin 50 of one block 10–30 and 60–94 abuts the pin 50 of another block 10–30 and 60–94, as shown in the top-level floorplan 100A for an abutted-pin hierarchical physical design in FIG. 1A.

Figure 1B:
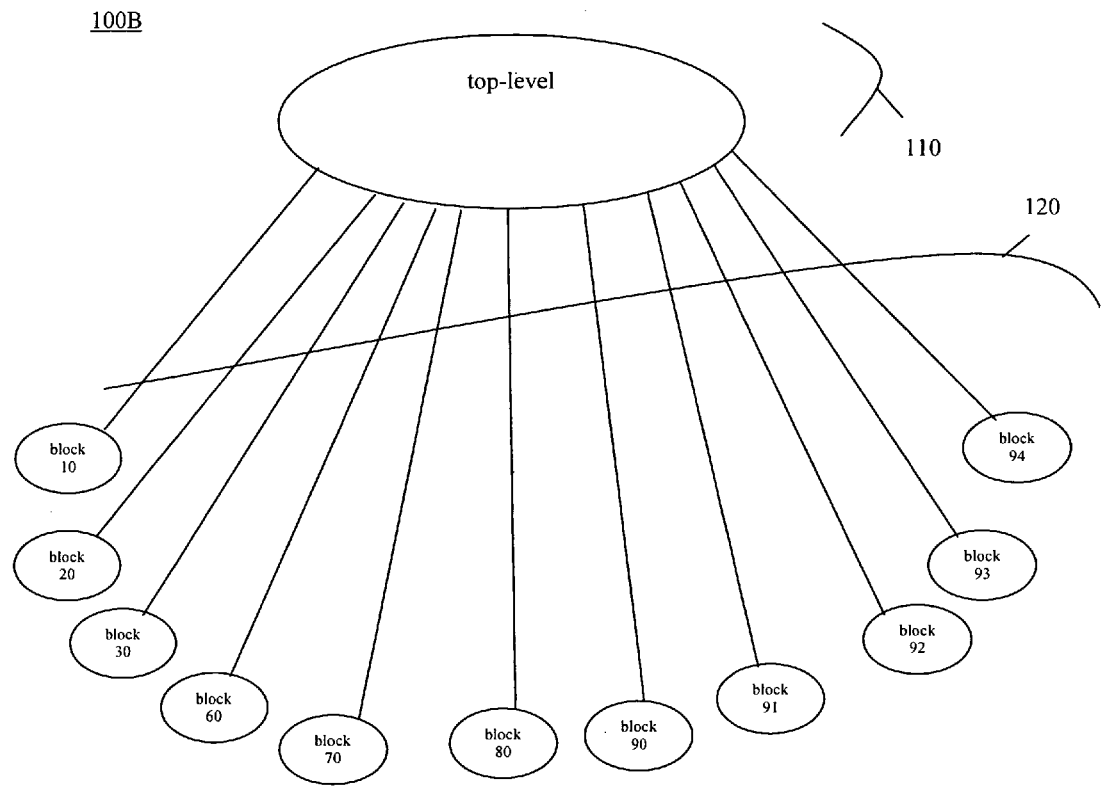
FIG. 1B illustrates the two-level hierarchy of the abutted-pin hierarchical physical design of FIG. 1A in accordance with an embodiment of the present invention.

FIG. 1B illustrates the two-level hierarchy 100B of the abutted-pin hierarchical physical design of FIG. 1A in accordance with an embodiment of the present invention. The two-level hierarchy 100B includes a top-level 110 and a block-level 120. The top-level 110 has the top-level floorplan 100A described with respect to FIG. 1A. Block-level 120 includes each block 10–30 and 60–94 of top-level floorplan 100A. The cells and macrocells of individual blocks 10–30 and 60–94 can be placed and routed in parallel, reducing physical design time and enabling higher magnitudes of optimization.

As discussed above, the top-level floorplanning stage of a hierarchical physical design includes determining the locations of pins for each block in the top-level floorplan. Each pin of a block represents a location where a signal enters the block or a location where a signal exits the block. The pins are utilized in placing and routing each block during block-level operations. At the top-level of a hierarchical physical design, a router is utilized to route nets representing two or more ports of different blocks that are connected. A global route is created for each of these nets. In general, a location of a pin is defined where the routing wire (or global route) crosses the boundary of the block. The goal of this top-level routing operation is determining location of the pins instead of creating the optimized routing wire for the net since the optimized placement and routing stages of the nets are performed at the block-level.

Figure 2A:
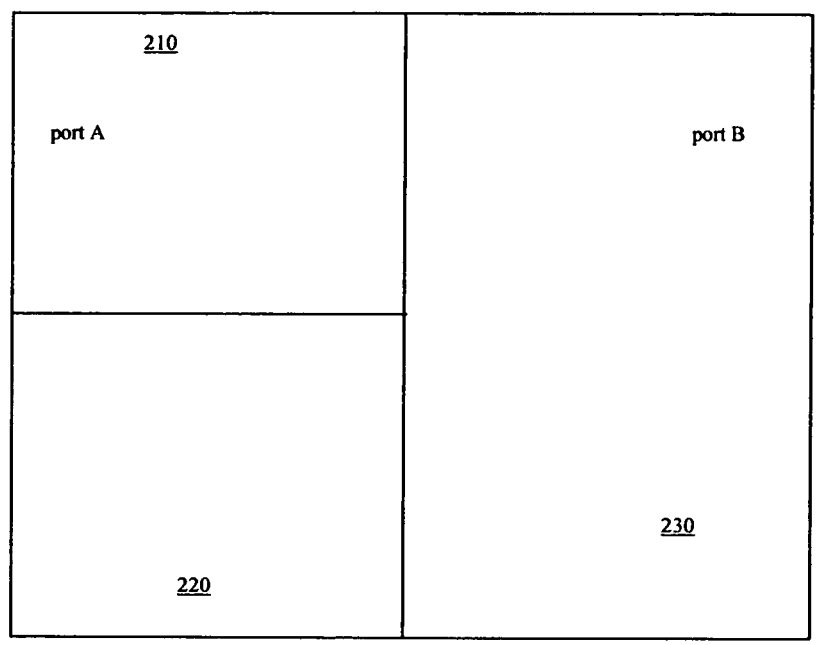
FIGS. 2A–2D illustrate determination of a pin location at the top-level of a hierarchical physical design in accordance with an embodiment of the present invention.

FIGS. 2A–2D illustrate determination of a pin location at the top-level of a hierarchical physical design in accordance with an embodiment of the present invention. Only the core area of the hierarchical physical design is shown. As depicted in FIG. 2A, the top-level floorplan 200 for the hierarchical physical design includes blocks 210–230. Moreover, the edge of one block abuts the edge of another block. The top-level floorplan 200 does not have routing channels.

Figure 2B:
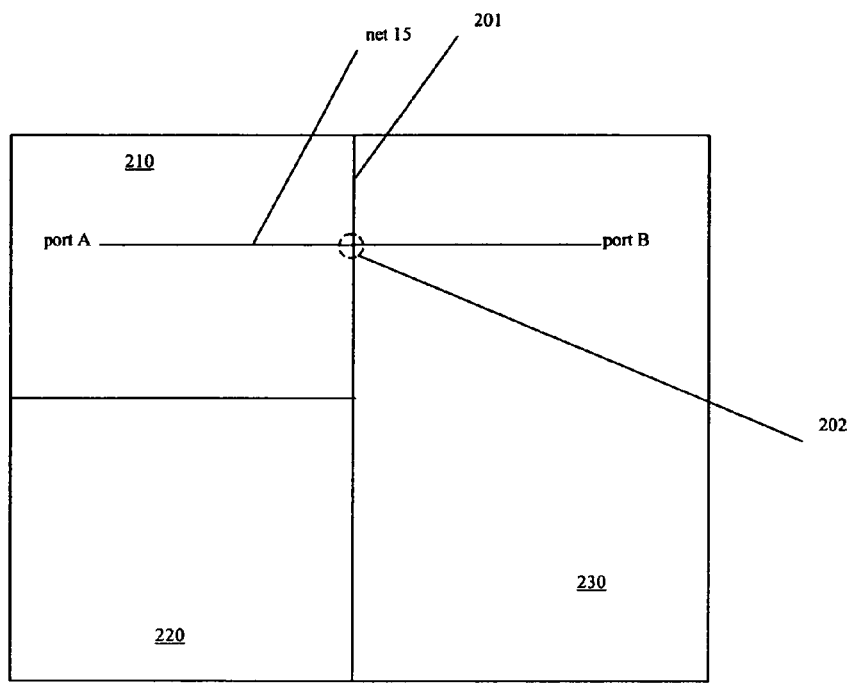

Block 210 has the port A while block 230 has the port B. Moreover, the netlist supplied to the floorplanning stage includes net 15 that connects port A and port B. Referring to FIG. 2B, a router performs a top-level route to represent net 15 on the top-level floorplan 200. That is, a global route 15 is created to correspond to net 15. As shown in FIG. 2B, net 15 crosses the edge 201 or boundary shared by block 210 and 230. At location 202, net 15 crosses the edge 201 or boundary shared by block 210 and block 230.

Figure 2C:
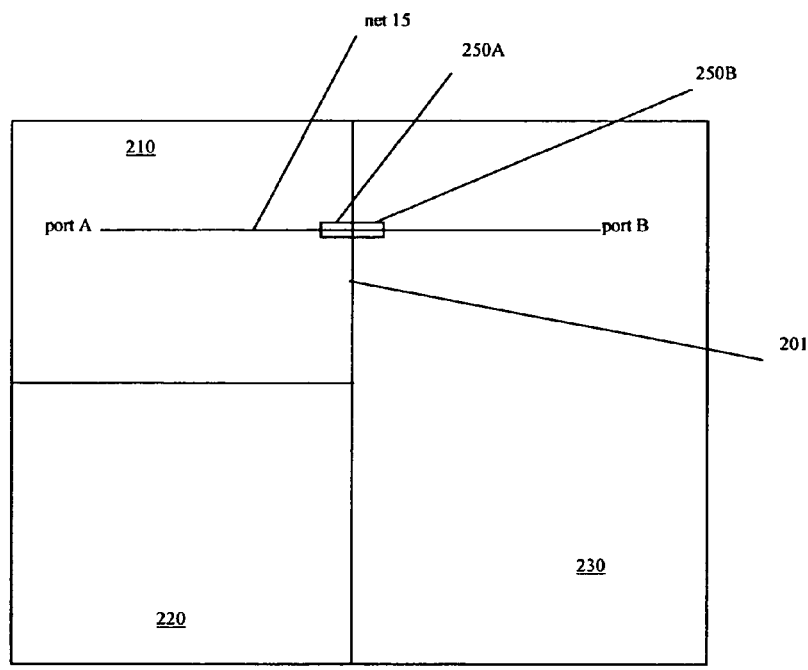
Figure 2D:
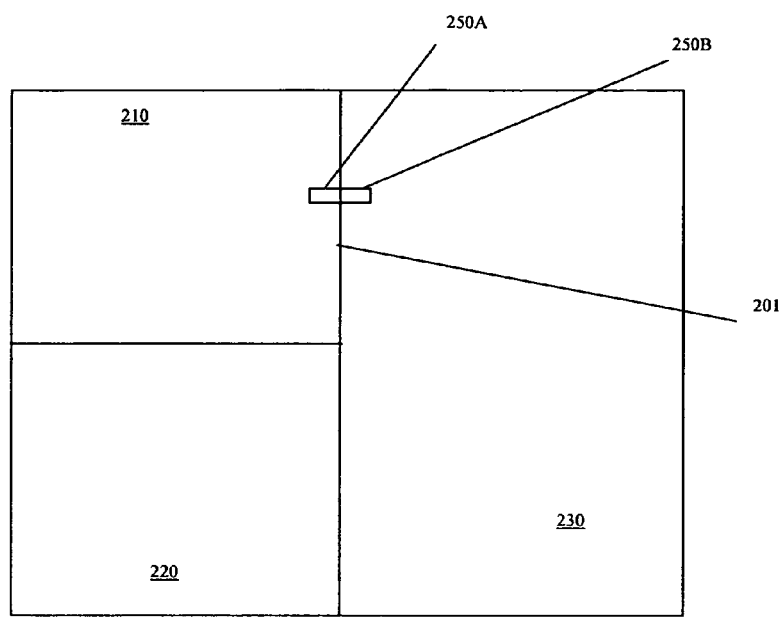

Continuing, FIG. 2C shows that a pin 250A is defined for block 210 where the net 15 (or global route) crosses the edge 201 or boundary. Similarly, a pin 250B is defined for block 230 where the net 15 (or global route) crosses the edge 201 or boundary. Since pin 250A and pin 250B are abutted, the top-level floorplan 200 is a top-level floorplan for an abutted-pin hierarchical physical design. Furthermore, FIG. 2D shows, at the top-level, the blocks 210 and 230 and the pins 250A and 250B. At the block-level, the placement and routing stages of block 210 will create an optimized routing wire for net 15 and will couple the optimized routing wire to pin 250A. Similarly, at the block-level, the placement and routing stages of block 230 will create an optimized routing wire for net 15 and will couple the optimized routing wire to pin 250B.

Since the operations described with respect to FIGS. 2A–2D are executed at the top-level, these top-level operations affect the optimization at the block-level for blocks 210–230. FIGS. 2A–2D focused on nets that crossed the edges or boundaries between different blocks. However, each block 210–230 also includes nets that connect ports within each block 210–230 without crossing an edge or boundary of the block. Thus, global nets (nets that cross an edge or boundary) and local nets (nets that do not cross an edge or boundary and remain within a single block) are routed at the block-level within each block 210–230.

In FIGS. 2A–2D, the impact of the local nets on the determination of the location of pins 250A and 250B was not addressed. After blocks 210–230 have undergone the placement and routing stages at the block-level, routing congestion areas of each block 210–230 can be identified. Typically, a routing congestion area is an area of the physical design that utilizes a large portion of the routing resources (e.g., routing tracks, routing metal, etc.) available in the area.

Figure 3:
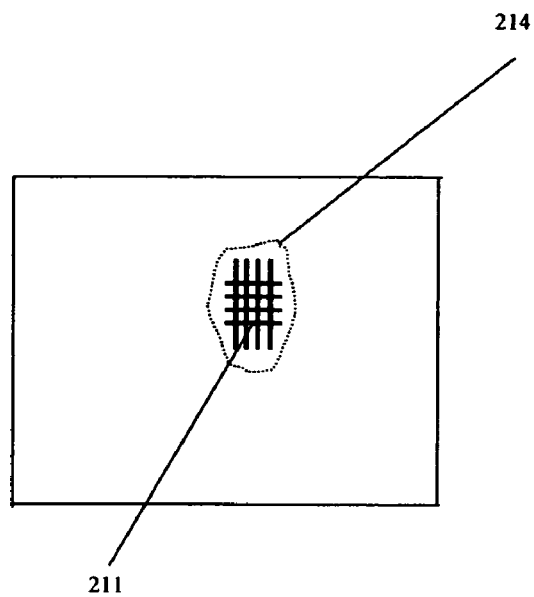
FIG. 3 illustrates locally generated routing congestion at the block-level of a hierarchical physical design in accordance with an embodiment of the present invention.

In FIG. 3, a routing congestion area 214 of block 210 at the block-level is shown. In particular, the routing congestion area 214 shows locally generated routing congestion at the block-level of a hierarchical physical design in accordance with an embodiment of the present invention. The locally generated routing congestion is due to the routing of local nets 211. In general, a routing congestion area includes routing wires for global nets and routing wires for local nets, wherein each contributes to the routing congestion.

A method of determining a plurality of locations of pins for each block of a physical design of a current integrated circuit is shown in FIGS. 4–7 in accordance with an embodiment of the present invention. The method includes retrieving physical design information from a prior physical design of a prior integrated circuit. The physical design information includes a routing congestion profile. Continuing, a router is provided a plurality of constraints based on the routing congestion profile. Then, the router is used to perform a top-level route for generating locations of pins for each block. Each pin of the block is created at a location where a global route (corresponding to a global net) enters the block or a location where a global route (corresponding to a global net) exits the block.

Figure 4:
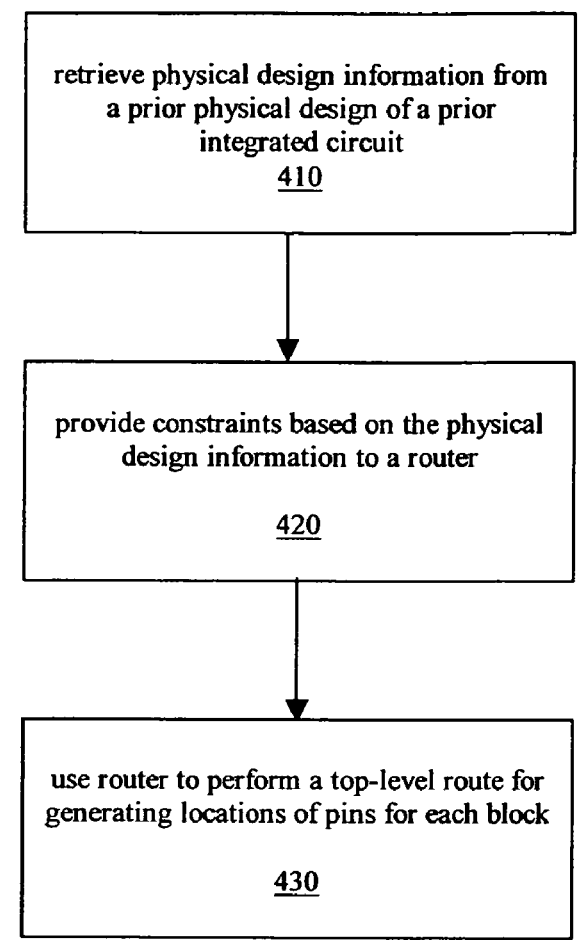
FIG. 4 illustrates a flow chart showing a method of determining a plurality of pin locations for each block of a physical design of a current integrated circuit in accordance with an embodiment of the present invention.

FIG. 4 illustrates a flow chart showing a method 400 of determining a plurality of pin locations for each block of a physical design of a current integrated circuit in accordance with an embodiment of the present invention. In an embodiment, the physical design is a hierarchical physical design.

At Step 410, physical design information from a prior physical design of a prior integrated circuit is retrieved. For example, this physical design information is retrieved from a database where it is stored. Ideally, the prior integrated circuit is an earlier version of the current integrated circuit, but is not required to be an earlier version of the current integrated circuit. Since the prior physical design of the prior integrated circuit has been optimized at the top-level and block-level to conform to design specifications, the physical design information provides useful data to optimize the physical design of the current integrated circuit. In particular, the physical design information enables determination of locations of pins for blocks to avoid or reduce the routing congestion areas described above.

In an embodiment, the physical design information includes a routing congestion profile of the prior physical design. Moreover, the physical design information includes the location of obstructions, such as a RAM, that affect the placement and routing stages. FIG. 5 illustrates an exemplary routing congestion profile 500 in accordance with an embodiment of the present invention. Here, the exemplary routing congestion profile 500 divides the chip area of the physical design into a grid, wherein each section of the grid provides a number representing the percentage of routing resources utilized in that section of the chip area. Routing congestion areas are characterized by high numbers in the exemplary routing congestion profile 500. Numbers such as 80, 90, and 95 are associated with routing congestion areas. It should be understood that a routing congestion profile can be implemented in other ways, such as a color-coded map of the chip area.

Figure 6:
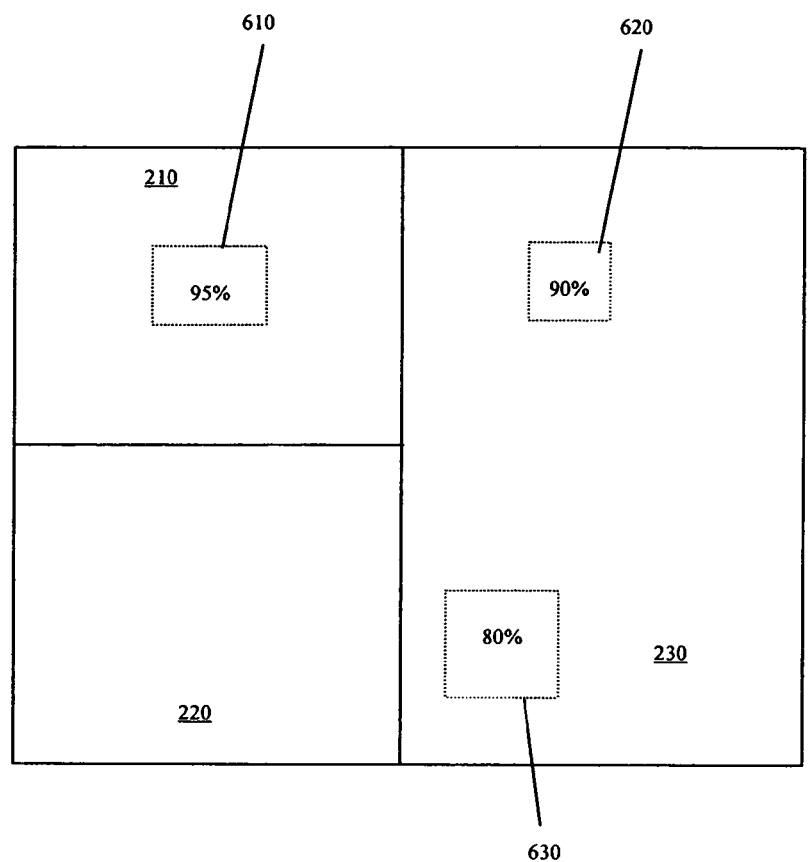
FIG. 6 illustrates, at the top-level of a hierarchical physical design, providing a router with constraints based on a routing congestion profile in accordance with an embodiment of the present invention.

Continuing, at Step 420, constraints based on the physical design information of the prior physical design are provided to the router that will perform the top-level route to determine the location of pins for each block at the top-level. In an embodiment, the constraints are based on the routing congestion profile of the prior physical design. In yet another embodiment, the constraints are based on the routing congestion profile and location of obstructions of the prior physical design. Moreover, the constraints can be based on any data from the prior physical design. FIG. 6 illustrates, at the top-level of a hierarchical physical design, providing a router with constraints based on a routing congestion profile of the prior physical design in accordance with an embodiment of the present invention, wherein the router will perform the top-level route to determine the location of pins for each block at the top-level. As shown in FIG. 6, the chip areas 610 (of block 210), 620 (of block 230), and 630 (of block 230) and the corresponding routing congestion numbers 95%, 90%, and 80% are provided to the router. These constraints cause the router to avoid the chip areas 610, 620, and 630 as much as possible when routing the global nets for determining the location of pins for each block at the top-level.

Figure 7:
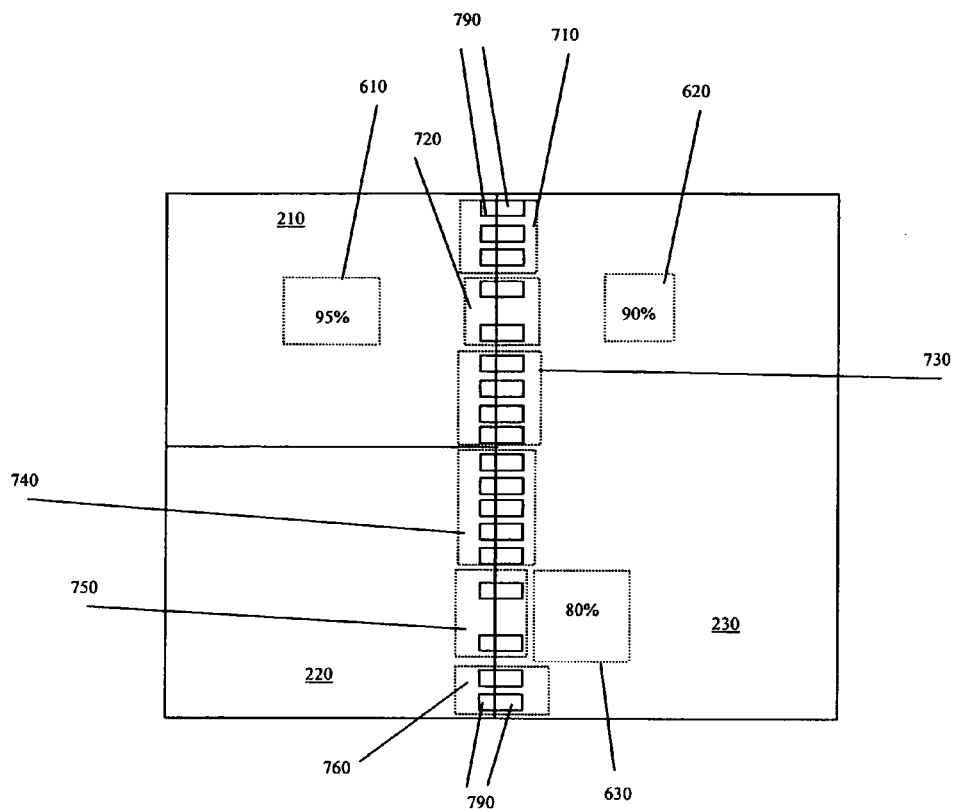
FIG. 7 illustrates, at the top-level of a hierarchical physical design, locations of pins using the router (with constraints) in accordance with an embodiment of the present invention.

Furthermore, at Step 430, the router (with constraints) is utilized to perform a top-level route for generating locations of pins 790 for each block 210–230 (see FIG. 7). Each pin 790 of a block 210–230 is created at a location where a global route (corresponding to a global net) enters the block 210–230 or a location where a global route (corresponding to a global net) exits the block 210–230. Improved distribution of pins 790 is achieved to avoid or reduce the routing congestion areas identified in the prior physical design. FIG. 7 illustrates, at the top-level of a hierarchical physical design, locations of pins 790 using the router (with constraints) in accordance with an embodiment of the present invention. As depicted in FIG. 7, the pins 790 are divided into a plurality of groups 710–760. Moreover, the pins 790 are distributed based on the constraints provided to the router. The pins 790 in groups 710, 730, 740, and 760 are closely spaced. On the other hand, pins 790 in groups 720 and 750 are spaced farther apart than the pins 790 in groups 710, 730, 740, and 760. Hence, there are fewer pins 790 per unit area in groups 720 and 750 than in groups 710, 730, 740, and 760. This is consistent with the objective of avoiding or reducing the routing congestion areas identified in the prior physical design.

In an embodiment, the invention is performed by computer-executable instructions stored in a computer-readable medium, such as a magnetic disk, CD-ROM, an optical medium, a floppy disk, a flexible disk, a hard disk, a magnetic tape, a RAM, a ROM, a PROM, an EPROM, a flash-EPROM, or any other medium from which a computer can read.

Figure 8:
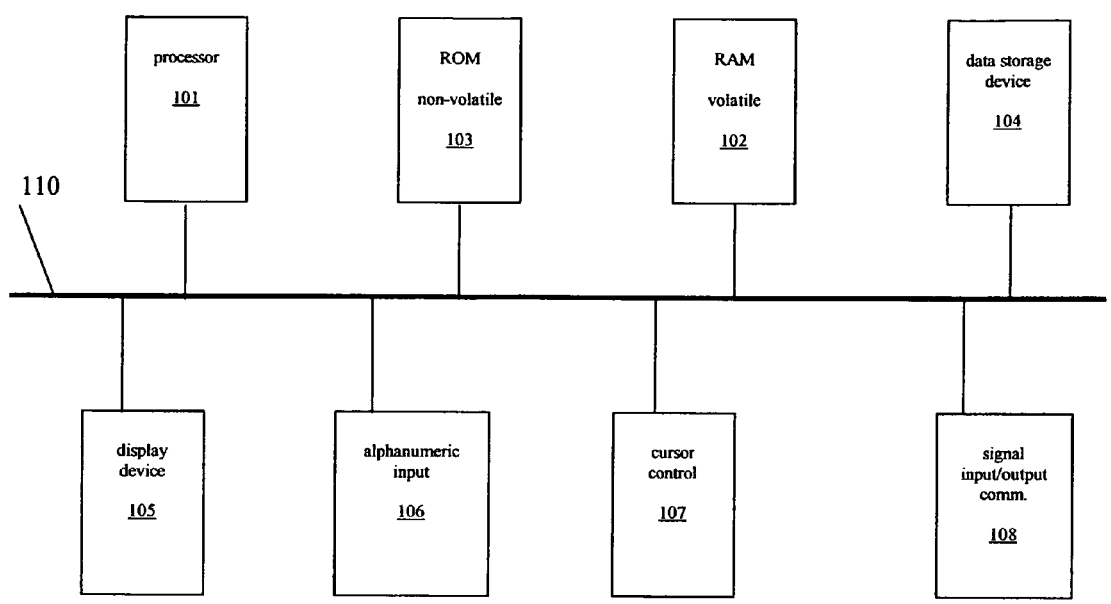
FIG. 8 illustrates an exemplary computer system on which embodiments of the present invention may be practiced.

FIG. 8 illustrates an exemplary computer system 800 on which embodiments of the present invention may be practiced. Aspects of the present invention can be implemented or executed on a computer system or any other computational system. Although a variety of different computer systems can be used with the present invention, an exemplary computer system 800 is shown in FIG. 8.

With reference to FIG. 8, portions of the present invention are comprised of computer-readable and computer executable instructions which reside, for example, in computer-usable media of an electronic system such as the exemplary computer system 800. FIG. 8 illustrates an exemplary computer system 800 on which embodiments of the present invention may be practiced. It is appreciated that the computer system 800 of FIG. 8 is exemplary only and that the present invention can operate within a number of different computer systems including general-purpose computer systems and embedded computer systems.

Computer system 800 includes an address/data bus 110 for communicating information, a central processor 101 coupled with bus 110 for processing information and instructions, a volatile memory 102 (e.g., random access memory RAM) coupled with the bus 110 for storing information and instructions for the central processor 101 and a non-volatile memory 103 (e.g., read only memory ROM) coupled with the bus 110 for storing static information and instructions for the processor 101. Exemplary computer system 800 also includes a data storage device 104 ("disk subsystem") such as a magnetic or optical disk and disk drive coupled with the bus 110 for storing information and instructions. Data storage device 104 can include one or more removable magnetic or optical storage media (e.g., diskettes, tapes) which are computer-readable memories.

Memory units of computer system 800 include volatile memory 102, non-volatile memory 103 and data storage device 104.

Exemplary computer system 800 can further include a signal Input/Output communication device 108 (e.g., a network interface card "NIC") coupled to the bus 110 for interfacing with other computer systems. Also included in exemplary computer system 800 of FIG. 8 is an alphanumeric input device 106 including alphanumeric and function keys coupled to the bus 110 for communicating information and command selections to the central processor 101. Exemplary computer system 800 also includes a cursor control or directing device 107 coupled to the bus 110 for communicating user input information and command selections to the central processor 101. A display device 105 can also be coupled to the bus 110 for displaying information to the computer user. Display device 105 may be a liquid crystal device, other flat panel display, cathode ray tube, or other display device suitable for creating graphic images and alphanumeric characters recognizable to the user. Cursor control device 107 allows the user to dynamically signal the two-dimensional movement of a visible symbol (cursor) on a display screen of display device 105. Many implementations of cursor control device 107 are known in the art including a trackball, mouse, touch pad, joystick or special keys on alphanumeric input device 106 capable of signaling movement of a given direction or manner of displacement. Alternatively, it will be appreciated that a cursor can be directed and/or activated via input from alphanumeric input device 106 using special keys and key sequence commands.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of determining a plurality of locations of pins for each block of a physical design of a current integrated circuit, said method comprising:
   retrieving physical design information from a prior physical design of a prior integrated circuit, wherein said physical design information includes a routing congestion profile;
   providing to a router a plurality of constraints based on said routing congestion profile; and
   using said router to perform a top-level route for generating locations of pins for each block, wherein each pin of said block is created at one of a location where a global route enters said block and a location where a global route exits said block.

2. The method as recited in claim 1 wherein said physical design is a hierarchical physical design.

3. The method as recited in claim 2 wherein said hierarchical physical design has a top-level and a block-level.

4. The method as recited in claim 2 wherein said hierarchical physical design is an abutted-pin hierarchical physical design.

5. The method as recited in claim 1 wherein said physical design information includes location of obstructions.

6. The method as recited in claim 5 further comprising providing to said router a plurality of second constraints based on said location of said obstructions.

7. The method as recited in claim 6 further comprising using said router to perform said top-level route for generating locations of pins for each block based on said second constraints.

8. A computer-readable medium comprising computer-executable instructions stored therein for performing a method of determining a plurality of locations of pins for each block of a physical design of a current integrated circuit, said method comprising:
retrieving physical design information from a prior physical design of a prior integrated circuit, wherein said physical design information includes a routing congestion profile;
providing to a router a plurality of constraints based on said routing congestion profile; and
using said router to perform a top-level route for generating locations of pins for each block, wherein each pin of said block is created at one of a location where a global route enters said block and a location where a global route exits said block.

9. The computer-readable medium as recited in claim 8 wherein said physical design is a hierarchical physical design.

10. The computer-readable medium as recited in claim 9 wherein said hierarchical physical design has a top-level and a block-level.

11. The computer-readable medium as recited in claim 9 wherein said hierarchical physical design is an abutted-pin hierarchical physical design.

12. The computer-readable medium as recited in claim 8 wherein said physical design information includes location of obstructions.

13. The computer-readable medium as recited in claim 12 wherein said method further comprises providing to said router a plurality of second constraints based on said location of said obstructions.

14. The computer-readable medium as recited in claim 13 wherein said method further comprises using said router to perform said top-level route for generating locations of pins for each block based on said second constraints.

15. A computer system comprising:

a processor coupled to a bus; and a memory device couples to said bus, wherein said memory device includes computer-executable instructions stored therein for performing a method of determining a plurality of locations of pins for each block of a physical design of a current integrated circuit, said method comprising:

retrieving physical design information from a prior physical design of a prior integrated circuit, wherein said physical design information includes a routing congestion profile;

providing to a router a plurality of constraints based on said routing congestion profile; and using said router to perform a top-level route for generating locations of pins for each block, wherein each pin of said block is created at one of a location where a global route enters said block and a location where a global route exits said block.

16. The computer system as recited in claim 15 wherein said physical design is a hierarchical physical design.

17. The computer system as recited in claim 16 wherein said hierarchical physical design has a top-level and a block-level.

18. The computer system as recited in claim 16 wherein said hierarchical physical design is an abutted-pin hierarchical physical design.

19. The computer system as recited in claim 15 wherein said physical design information includes location of obstructions.

20. The computer system as recited in claim 19 wherein said method further comprises providing to said router a plurality of second constraints based on said location of said obstructions.

21. The computer system as recited in claim 20 wherein said method further comprises using said router to perform said top-level route for generating locations of pins for each block based on said second constraints.

* * * * *

UNITED STATES PATENT AND TRADEMARK OFFICE
CERTIFICATE OF CORRECTION

PATENT NO. : 7,114,142 B1 Page 1 of 1
APPLICATION NO. : 10/855667
DATED : September 26, 2006
INVENTOR(S) : Russell Segal and Paul Rodman It is certified that error appears in the above-identified patent and that said Letters Patent is hereby corrected as shown below:

Title Page – Assignee item 73 delete "Magam" and insert --Magma-- delete "Automoation" and insert --Automation--

Signed and Sealed this

Twelfth Day of December, 2006

JON W. DUDAS
*Director of the United States Patent and Trademark Office*